(12) United States Patent
Kasuya et al.

(10) Patent No.: US 12,052,818 B2
(45) Date of Patent: Jul. 30, 2024

(54) RESIN MULTILAYER SUBSTRATE

(71) Applicant: Murata Manufacturing Co., Ltd., Nagaokakyo (JP)

(72) Inventors: Atsushi Kasuya, Nagaokakyo (JP); Tomohiko Naruoka, Nagaokakyo (JP); Noriaki Okuda, Nagaokakyo (JP); Kosuke Nishio, Nagaokakyo (JP); Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 158 days.

(21) Appl. No.: 17/898,548

(22) Filed: Aug. 30, 2022

(65) Prior Publication Data

US 2022/0418103 A1    Dec. 29, 2022

Related U.S. Application Data

(63) Continuation of application No. PCT/JP2021/007753, filed on Mar. 1, 2021.

(30) Foreign Application Priority Data

Mar. 11, 2020  (JP) ................. 2020-042129
Oct. 7, 2020   (JP) ................. 2020-169969

(51) Int. Cl.
*H05K 1/03*      (2006.01)
*H05K 1/02*      (2006.01)
*H05K 3/00*      (2006.01)

(52) U.S. Cl.
CPC .......... *H05K 1/036* (2013.01); *H05K 1/0201* (2013.01); *H05K 1/0215* (2013.01);
(Continued)

(58) Field of Classification Search
CPC ............................ H05K 1/036; H05K 1/0218
See application file for complete search history.

(56) References Cited

U.S. PATENT DOCUMENTS

2012/0000695 A1    1/2012  Chisaka
2017/0188459 A1    6/2017  Yosui et al.
(Continued)

FOREIGN PATENT DOCUMENTS

JP    H0786814 A      3/1995
JP    2004342978 A   12/2004
(Continued)

OTHER PUBLICATIONS

International Search Report in PCT/JP2021/007753, mailed May 11, 2021, 3 pages.
(Continued)

*Primary Examiner* — Jeremy C Norris
(74) *Attorney, Agent, or Firm* — Keating & Bennett, LLP (57) ABSTRACT

A resin multilayer substrate includes a multilayer body including resin base-material layers laminated in a thickness direction and a circuit conductor therein, an end-surface ground conductor provided directly on each end surface of the multilayer body in the thickness direction, an adhesion layer on a side surface of the multilayer body, and a side-surface ground conductor on the adhesion layer. The end-surface and side-surface ground conductors are made of a ground conductor material with a coefficient of thermal expansion whose difference from a coefficient of thermal expansion of the resin base-material layers in a plane direction is smaller than a difference from a coefficient of thermal expansion of the resin base-material layers in the thickness direction. The adhesion layer is made of a material (Continued)

with higher adhesiveness to the side surface of the multi-layer body than adhesiveness of the ground conductor material.

20 Claims, 4 Drawing Sheets

(52) U.S. Cl.
CPC ... *H05K 3/0064* (2013.01); *H05K 2201/0129* (2013.01); *H05K 2201/0141* (2013.01); *H05K 2201/015* (2013.01); *H05K 2201/0323* (2013.01); *H05K 2201/068* (2013.01)

(56) References Cited

U.S. PATENT DOCUMENTS

2018/0092201 A1   3/2018   Otsubo et al.
2018/0338396 A1   11/2018  Torita et al.

FOREIGN PATENT DOCUMENTS

| | | |
|---|---|---|
| JP | 2007027396 A | 2/2007 |
| JP | 2009246316 A | 10/2009 |
| JP | 2011061059 A | 3/2011 |
| JP | 2018011033 A | 1/2018 |
| WO | 2010103940 A1 | 9/2010 |
| WO | 2016031691 A1 | 3/2016 |
| WO | 2016195026 A1 | 12/2016 |
| WO | 2018212044 A1 | 11/2018 |

OTHER PUBLICATIONS

Written Opinion in PCT/JP2021/007753, mailed May 11, 2021, 4 pages.
Office Action in JP2022-505931, mailed Jun. 27, 2023, 3 pages.

RESIN MULTILAYER SUBSTRATE

CROSS REFERENCE TO RELATED APPLICATIONS

This application claims the benefit of priority to Japanese Patent Application No. 2020-169969 filed on Oct. 7, 2020 and Japanese Patent Application No. 2020-042129 filed on Mar. 11, 2020, and is a Continuation Application of PCT Application No. PCT/JP2021/007753 filed on Mar. 1, 2021. The entire contents of each application are hereby incorporated herein by reference.

BACKGROUND OF THE INVENTION

1. Field of the Invention

The present invention relates to a resin multilayer substrate formed by laminating a plurality of resin base-material layers.

2. Description of the Related Art

International Publication No. 2016/031691 discloses a resin multilayer substrate formed by laminating a plurality of sheet-shaped resin base-material layers. A ground conductor is formed on a side surface of the resin multilayer substrate.

In the resin multilayer substrate as described in International Publication No. 2016/031691, there is a possibility of the ground conductor exfoliating from the side surface of the resin multilayer substrate due to thermal expansion of the plurality of resin base-material layers constituting the resin multilayer substrate.

SUMMARY OF THE INVENTION

Preferred embodiments of the present invention provide resin multilayer substrates each including a plurality of resin base-material layers that are laminated and a ground conductor on a side surface thereof, and each able to reduce or prevent peeling of the ground conductor from the side surface due to thermal expansion of the resin base-material layer.

A resin multilayer substrate according to a preferred embodiment of the present invention includes a multilayer body including a plurality of resin base-material layers laminated in a thickness direction and a circuit conductor therein, an end-surface ground conductor provided directly on each end surface of the multilayer body in the thickness direction, an adhesion layer on a side surface of the multilayer body, and a side-surface ground conductor on the adhesion layer, wherein the end-surface ground conductor and the side-surface ground conductor are made of a ground conductor material with a coefficient of thermal expansion whose difference from a coefficient of thermal expansion of the resin base-material layers in a plane direction is smaller than a difference from a coefficient of thermal expansion of the resin base-material layers in the thickness direction, and the adhesion layer is made of a material with higher adhesiveness to the side surface of the multilayer body than adhesiveness of the ground conductor material.

A method of manufacturing a resin multilayer substrate according to a preferred embodiment of the present invention includes making a multilayer body by laminating, in a thickness direction, a plurality of resin films including a conductor layer, the multilayer body including an end-surface ground conductor provided directly on each end surface of the multilayer body in the thickness direction, and a circuit conductor inside the multilayer body, forming an adhesion layer on a side surface of the multilayer body, and forming a conductor layer to define a side-surface ground conductor on the adhesion layer, wherein the end-surface ground conductor and the side-surface ground conductor are made of a ground conductor material with a coefficient of thermal expansion whose difference from a coefficient of thermal expansion of resin base-material layers in a plane direction is smaller than a difference from a coefficient of thermal expansion of the resin base-material layers in the thickness direction, and the adhesion layer is made of a material with higher adhesiveness to the side surface of the multilayer body than adhesiveness of the ground conductor material.

A method of manufacturing a resin multilayer substrate according to a preferred embodiment of the present invention includes making a multilayer body by laminating, in a thickness direction, a plurality of resin films including a conductor layer, the multilayer body including an end-surface ground conductor provided directly on each end surface of the multilayer body in the thickness direction, and a circuit conductor inside the multilayer body, forming an adhesion layer on a side surface of the multilayer body, and forming a side-surface ground conductor by applying a ground conductor material on the adhesion layer, wherein the end-surface ground conductor and the side-surface ground conductor are made of the ground conductor material with a coefficient of thermal expansion whose difference from a coefficient of thermal expansion of resin base-material layers in a plane direction is smaller than a difference from a coefficient of thermal expansion of the resin base-material layers in the thickness direction, and the adhesion layer is made of a material with higher adhesiveness to the side surface of the multilayer body than adhesiveness of the ground conductor material.

According to preferred embodiments of the present invention, peeling of a ground conductor from a side surface due to thermal expansion of a resin base-material layer is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A resin multilayer substrate according to a preferred embodiment of the present invention includes a multilayer body including a plurality of resin base-material layers laminated in a thickness direction and a circuit conductor therein, an end-surface ground conductor provided directly on each end surface of the multilayer body in the thickness direction, an adhesion layer on a side surface of the multilayer body, and a side-surface ground conductor on the adhesion layer. The end-surface ground conductor and the side-surface ground conductor are made of a ground conductor material with a coefficient of thermal expansion whose difference from a coefficient of thermal expansion of the resin base-material layers in a plane direction is smaller than a difference from a coefficient of thermal expansion of the resin base-material layers in the thickness direction. The adhesion layer is made of a material with higher adhesiveness to the side surface of the multilayer body than adhesiveness of the ground conductor material.

In the resin multilayer substrate which includes the plurality of laminated resin base-material layers and the ground conductor on the side surface thereof, peeling of the ground conductor from the side surface due to the thermal expansion of the resin base-material layer can be reduced or prevented.

For example, the adhesion layer may be made of a metallic material.

For example, the adhesion layer may be made of a metallic material with a coefficient of thermal expansion between the coefficient of thermal expansion of the ground conductor material and the coefficient of thermal expansion of the resin base-material layers in the thickness direction.

For example, the adhesion layer may be made of a metallic material configured to oxidize more easily than the ground conductor material.

For example, the side-surface ground conductor may be made of a ground conductor material whose main component is Ti or C.

For example, a thickness of the adhesion layer may be smaller than a thickness of the side-surface ground conductor.

For example, a surface roughness of the side surface of the multilayer body may be higher than a surface roughness of the end surface.

For example, the resin base-material layers may be made of a thermoplastic resin including a liquid crystal polymer resin.

For example, the multilayer body may include an adhesive layer which is located between resin base-material layers adjacent to each other and includes a fluoropolymer.

A method of manufacturing a resin multilayer substrate according to a preferred embodiment of the present invention includes making a multilayer body by laminating, in a thickness direction, a plurality of resin films including a conductor layer, the multilayer body including an end-surface ground conductor provided directly on each end surface of the multilayer body in the thickness direction, and a circuit conductor provided inside the multilayer body, forming an adhesion layer on a side surface of the multilayer body, and forming a conductor layer configured to be a side-surface ground conductor on the adhesion layer. The end-surface ground conductor and the side-surface ground conductor are made of a ground conductor material with a coefficient of thermal expansion whose difference from a coefficient of thermal expansion of resin base-material layers in a plane direction is smaller than a difference from a coefficient of thermal expansion of the resin base-material layers in the thickness direction. The adhesion layer is made of a material with higher adhesiveness to the side surface of the multilayer body than adhesiveness of the ground conductor material.

In the resin multilayer substrate which is formed by laminating the plurality of resin base-material layers and includes the ground conductor on the side surface thereof, peeling of the ground conductor from the side surface due to the thermal expansion of the resin base-material layer can be reduced or prevented.

A method of manufacturing a resin multilayer substrate according to a preferred embodiment of the present invention includes making a multilayer body by laminating, in a thickness direction, a plurality of resin films including a conductor layer, the multilayer body including an end-surface ground conductor provided directly on each end surface of the multilayer body in the thickness direction, and a circuit conductor provided inside the multilayer body, forming an adhesion layer on a side surface of the multilayer body, and forming a side-surface ground conductor by applying a ground conductor material on the adhesion layer. The end-surface ground conductor and the side-surface ground conductor are made of the ground conductor material with a coefficient of thermal expansion whose difference from a coefficient of thermal expansion of resin base-material layers in a plane direction is smaller than a difference from a coefficient of thermal expansion of the resin base-material layers in the thickness direction. The adhesion layer is made of a material with higher adhesiveness to the side surface of the multilayer body than adhesiveness of the ground conductor material.

In the resin multilayer substrate which is formed by laminating the plurality of resin base-material layers and includes the ground conductor on the side surface thereof, peeling of the ground conductor from the side surface due to the thermal expansion of the resin base-material layer can be reduced or prevented.

For example, a main component of the ground conductor material of the side-surface ground conductor may be Ti or C.

Preferred embodiments of the present invention are described below with reference to the drawings.

Figure 1:
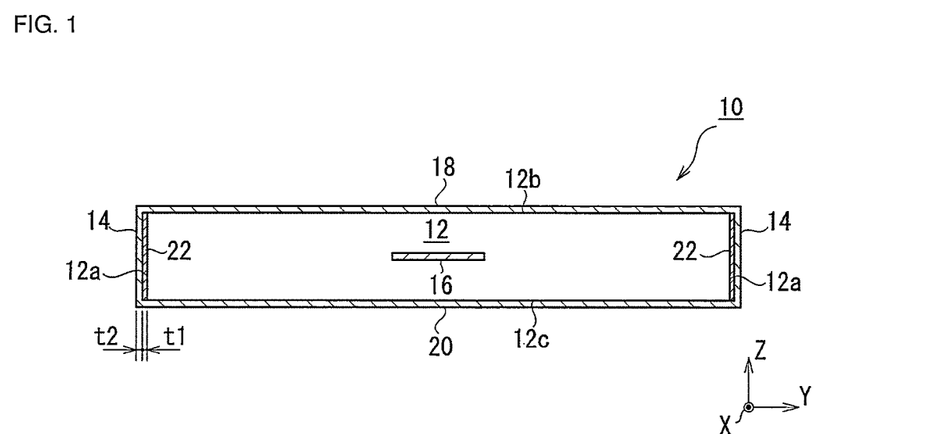
FIG. 1 is a sectional view of a resin multilayer substrate according to a preferred embodiment of the present invention.

FIG. 1 is a sectional view of a resin multilayer substrate according to a preferred embodiment of the present invention. Note that the X-Y-Z rectangular coordinate system illustrated in the drawings is to facilitate understanding of the description of preferred embodiments of the present invention and does not limit the present invention. Moreover, an X-axis direction and a Y-axis direction as used herein indicate a plane direction, and a Z-axis direction indicates a thickness direction.

As illustrated in FIG. 1, a resin multilayer substrate 10 according to the present preferred embodiment includes a multilayer body 12, a side-surface ground conductor 14 provided on a side surface 12a of the multilayer body 12, a circuit conductor 16 which is a circuit component provided in the multilayer body 12 and defining a high-frequency circuit, and end-surface ground conductors 18 and 20 respectively provided on both end surfaces 12b and 12c of the multilayer body 12 in the thickness direction (Z-axis direction). The side-surface ground conductor 14 is provided to the side surface 12a of the multilayer body 12 with an adhesion layer 22 interposed therebetween.

These components of the resin multilayer substrate 10 will be described together with a non-limiting example of a manufacturing method of the resin multilayer substrate 10.

FIGS. 2A to 2F are views illustrating one example of manufacturing processes of a resin multilayer substrate according to a preferred embodiment of the present invention.

Figure 2A:
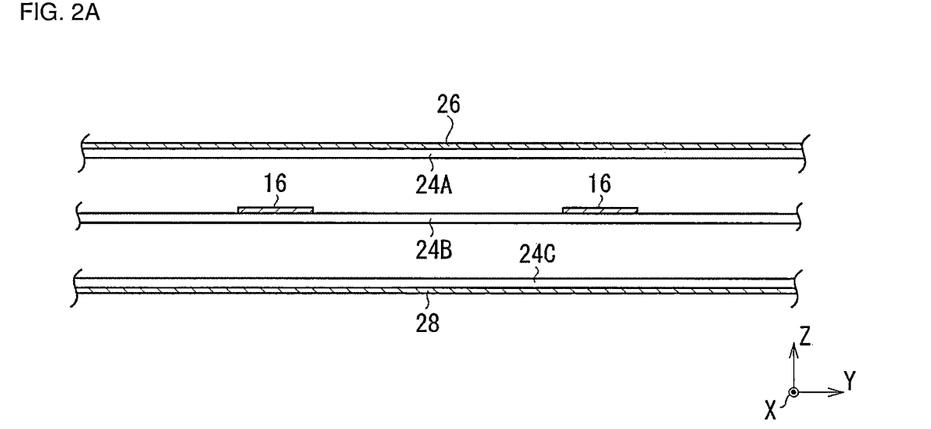
FIG. 2A is a view illustrating one example of a manufacturing process of a resin multilayer substrate according to a preferred embodiment of the present invention.

As illustrated in FIG. 2A, first, a plurality of sheet-shaped resin films 24A to 24C are stacked in the thickness direction (Z-axis direction). In the present preferred embodiment, the resin films 24A to 24C are made of a thermoplastic resin whose main raw material is, for example, a liquid crystal polymer resin. The thermoplastic resin has a higher coefficient of thermal expansion in the thickness direction than a coefficient of thermal expansion in the plane direction (X-axis direction and Y-axis direction). The resin films 24A to 24C may have the same thickness or different thicknesses. Further, the resin films 24A to 24C may be made of different materials.

In the present preferred embodiment, the multilayer body 12 is made by the plurality of resin films 24A to 24C being stacked in the thickness direction (Z-axis direction) and pressed in the thickness direction while heated. That is, the multilayer body 12 is made by the resin films being thermally pressure-bonded to each other.

Further, each of the plurality of resin films 24A to 24C is provided with a conductor layer (for example, copper foil).

Among the plurality of resin films 24A to 24C, the resin films 24A and 24C located at outer side portions in the thickness direction (Z-axis direction) are each directly provided with copper foil 26 or 28 on an entire or substantially an entire one end surface thereof in the thickness direction (Z-axis direction).

In the present preferred embodiment, the other resin film 24B is provided with the circuit conductor 16 which is larger in size in the plane direction (X-axis direction and Y-axis direction) than in the thickness direction (Z-axis direction). As illustrated in FIG. 1, the circuit conductor 16 is a signal line which transmits high-frequency signals and the circuit conductor 16 is located between the end-surface ground conductors 18 and 20 so as to define and function as a strip line. The circuit conductor 16 is made by, for example, patterning by etching copper foil provided over the entire or substantially the entire one end surface of the resin film 24B in the thickness direction.

Figure 2B:
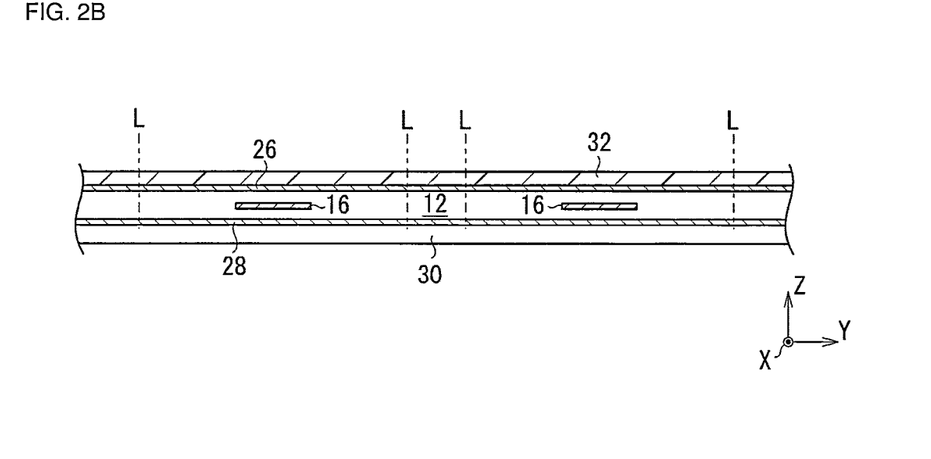
FIG. 2B is a view illustrating a manufacturing process subsequent to the manufacturing process illustrated in FIG. 2A.
Figure 2C:
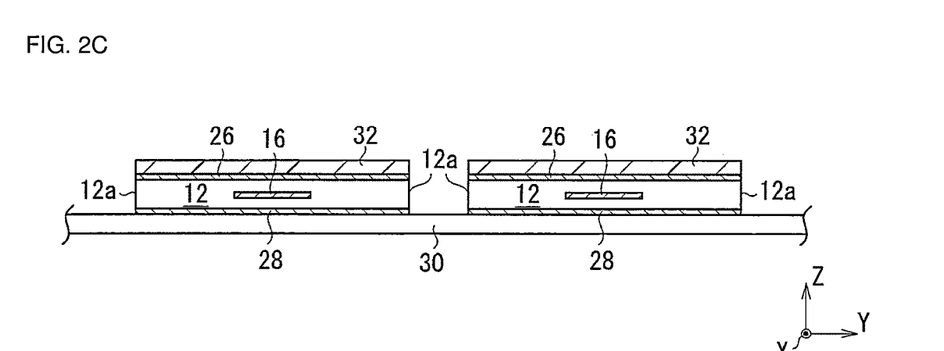
FIG. 2C is a view illustrating a manufacturing process subsequent to the manufacturing process illustrated in FIG. 2B.

As illustrated in FIG. 2B, the multilayer body 12 including the plurality of thermally pressure-bonded resin films 24A to 24C is attached on a carrier film 30 with, for example, a pressure-sensitive adhesive interposed therebetween. Then, the plurality of thermally pressure-bonded resin films 24A to 24C are selectively cut by a laser L or the like, for example, and unnecessary portions are removed. Therefore, as illustrated in FIG. 2C, the multilayer body 12 provided with the end-surface ground conductors 18 and 20 (a portion of the copper foil 26 and a portion of the copper foil 28) remains on the carrier film 30. That is, the multilayer body 12 including the plurality of laminated resin base-material layers (a portion of the resin films 24A to 24C) is formed. The carrier film 30 is not completely cut.

In the present preferred embodiment, before the plurality of thermally pressure-bonded resin films 24A to 24C are selectively cut, a resist layer 32 is formed thereon (that is, on the copper foil 26). The resist layer 32 is made by, for example, a photoresist method or the like.

Figure 2D:
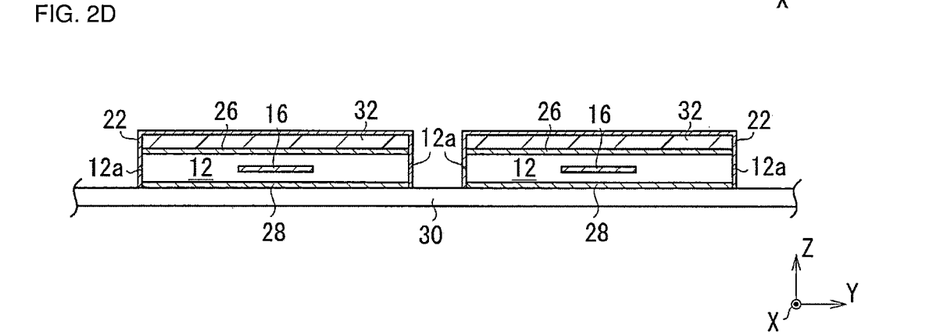
FIG. 2D is a view illustrating a manufacturing process subsequent to the manufacturing process illustrated in FIG. 2C.

As illustrated in FIG. 2D, the adhesion layer 22 is formed on the side surface 12a of the multilayer body 12 provided with the end-surface ground conductors 18 and 20, by film formation processing, such as, for example, vapor deposition, plating, or sputtering. In the present preferred embodiment, the adhesion layer 22 is formed also on the resist layer 32. Details and functions of the adhesion layer 22 will be described later.

Figure 2E:
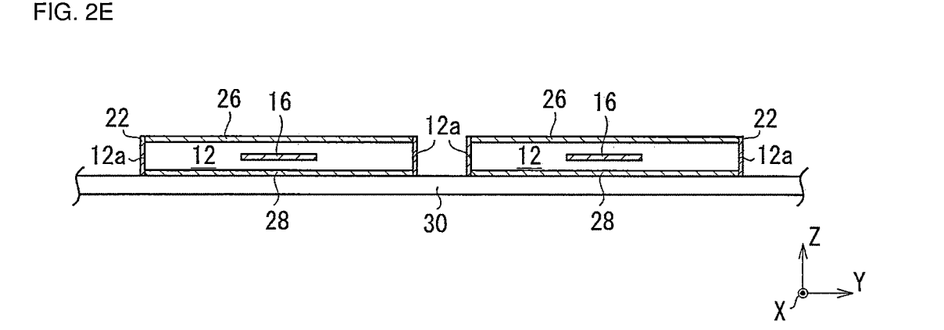
FIG. 2E is a view illustrating a manufacturing process subsequent to the manufacturing process illustrated in FIG. 2D.

As illustrated in FIG. 2E, the resist layer 32 is removed. Therefore, the adhesion layer 22 on the resist layer 32 is also removed, and the copper foil 26 provided to the multilayer body 12 is exposed.

Figure 2F:
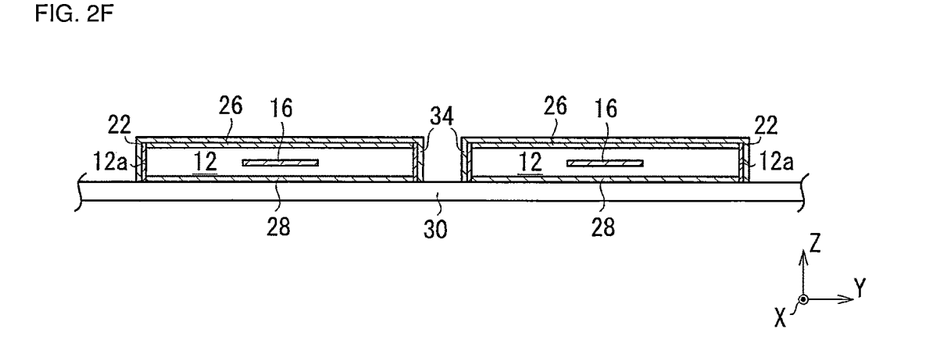
FIG. 2F is a view illustrating a manufacturing process subsequent to the manufacturing process illustrated in FIG. 2E.

Then, as illustrated in FIG. 2F, a copper layer 34 is formed on the adhesion layer 22 on the side surface 12a of the multilayer body 12 by film formation processing, such as, for example, vapor deposition, plating, or sputtering. In the present preferred embodiment, the copper layer 34 is formed also on the copper foil 26. Therefore, making the resin multilayer substrate 10 is completed on the carrier film 30.

That is, in the present preferred embodiment, one end-surface ground conductor 18 of the resin multilayer substrate 10 is made of the copper foil 26 and the copper layer 34.

As illustrated in FIG. 1, the end-surface ground conductors 18 and 20 and the side-surface ground conductor 14 define and function as a shield which prevents electromagnetic waves from radiating to the outside from the circuit (circuit conductor 16) in the multilayer body 12. Therefore, as a thickness necessary to define and function as the shield, the end-surface ground conductors 18 and 20 each have a thickness of about 10 µm, and the side-surface ground conductor 14 has a thickness of about 3 µm, for example.

As illustrated in FIG. 1, the adhesion layer 22 is interposed between the side surface 12a of the multilayer body 12 and the side-surface ground conductor 14. The adhesion layer 22 is made of a metallic material different from a metallic material of the side-surface ground conductor 14 and the end-surface ground conductors 18 and 20 (ground conductor material). More specifically, the ground conductor material is a metallic material with a coefficient of thermal expansion whose difference from a coefficient of thermal expansion of the resin base-material layer in the plane direction (X-axis direction and Y-axis direction) is smaller than a difference from a coefficient of thermal expansion of the resin base-material layer in the thickness direction (Z-axis direction). In the present preferred embodiment, since the ground conductor material is, for example, copper, the adhesion layer 22 is made of a metallic material different from copper (for example, nickel (Ni), chromium (Cr), nichrome, titanium (Ti), oxide thereof, or a metallic material including any of these as a main component). By such an adhesion layer 22 being interposed between the side-surface ground conductor 14 and the side surface 12a of the multilayer body 12, peeling of the side-surface ground conductor 14 from the side surface 12a can be reduced or prevented.

More specifically, when the side-surface ground conductor 14 is directly provided on the side surface 12a of the multilayer body 12, the side-surface ground conductor 14 may peel due to thermal expansion of the plurality of resin base-material layers of the multilayer body 12. This is because the coefficient of thermal expansion of the resin base-material layer in the thickness direction (Z-axis direction) is largely different from the coefficient of thermal expansion of the side-surface ground conductor.

For example, the plurality of the resin base-material layers of the multilayer body 12 have a coefficient of thermal expansion in the plane direction (X-axis direction and Y-axis direction) different from a coefficient of thermal expansion in the thickness direction (Z-axis direction). When the resin base-material layer is made of a thermoplastic resin whose main raw material is a liquid crystal polymer resin, the coefficient of thermal expansion in the plane direction is approximately 16 ppm, and the coefficient of thermal expansion in the thickness direction is approximately 300 ppm. On the other hand, when the side-surface ground conductor 14 is made of copper, the coefficient of thermal expansion thereof is approximately 17 ppm.

The "coefficient of thermal expansion in the thickness direction" of the resin base-material layer can be obtained by using, for example, laser interferometry. An interference fringe caused by laser light reflected on reflectors is captured while changing a temperature condition. The reflectors sandwich the base-material layer in the thickness direction. Since a change in the interference fringe has correspondence with the change in the thickness direction, the change in the base-material layer in the thickness direction due to the temperature change, that is, the "coefficient of thermal expansion in the thickness direction" can be calculated based on the change in the interference fringe due to the temperature change. Further, the "coefficient of thermal expansion in the thickness direction" may be calculated through similar measuring using the multilayer body where the base-material layers are laminated, without removing a single base-material layer. At this time, the measuring itself is performed on a portion of the multilayer body as a measurement range, the portion being in a pure state without a protective layer (for example, a resist layer) on a surface thereof and without a conductor on the surface or inside thereof.

Further, the "coefficient of thermal expansion in the plane direction" of the resin base-material layer can be obtained by using, for example, a thermo mechanical analysis (TMA) method. An amount of change in the resin base-material layer in the plane direction is measured while changing a temperature condition in a state where a constant tensile stress is applied in the plane direction. Accordingly, the change in the resin base-material layer in the plane direction due to the temperature change, that is, the "coefficient of thermal expansion in the plane direction" can be calculated. Further, the "coefficient of thermal expansion in the plane direction" may be calculated through similar measuring using the multilayer body where the base-material layers are laminated, without removing a single base-material layer. At this time, the measuring itself is performed on a portion of the multilayer body as a measurement range, the portion being in a pure state without a protective layer (for example, a resist layer) on a surface thereof and without a conductor on the surface or inside thereof.

That is, the difference between the coefficient of thermal expansion of the copper and the coefficient of thermal expansion of the resin base-material layer made of a liquid crystal polymer resin in the plane direction is smaller than the difference between the coefficient of thermal expansion of the copper and the coefficient of thermal expansion of the resin base-material layer in the thickness direction. Therefore, when the side surface 12a largely deforms in the thickness direction due to thermal expansion of the multilayer body 12 in the thickness direction (Z-axis direction), the side-surface ground conductor 14 on the side surface 12a cannot deform to the same or similar extent. Thus, stress concentration occurs at an interface between the multilayer body 12 and the side-surface ground conductor 14. Such stress concentration may cause the side-surface ground conductor 14 to peel from the side surface 12a of the multilayer body 12.

In order to reduce or prevent such peeling of the side-surface ground conductor 14, the adhesion layer 22 is made of a metallic material having higher adhesiveness to the side surface 12a of the multilayer body 12 than adhesiveness of the metallic material of the side-surface ground conductor 14 (ground conductor material) (for example, in the present preferred embodiment, copper). The expression "higher adhesiveness" as used herein means that peeling from the side surface 12a when the multilayer body 12 thermally expands is difficult. For example, the peeling difficulty, that is, superiority or inferiority in adhesiveness can be confirmed through a thermal fatigue test.

In order to have the higher adhesiveness, for example, the metallic material of the adhesion layer 22 preferably has a coefficient of thermal expansion between the coefficient of thermal expansion of the metallic material of the side-surface ground conductor 14 (ground conductor material) (for example, approximately 17 ppm in the case of copper) and the coefficient of thermal expansion of the resin base-material layer in the thickness direction (Z-axis direction) (for example, approximately 300 ppm in the case of a liquid crystal polymer resin). Therefore, the adhesion layer 22 eases the stress to be conveyed from the thermally expanded multilayer body 12 to the side-surface ground conductor 14. As a result, compared with the case without the adhesion layer 22 interposed therebetween, peeling of the side-surface ground conductor 14 can be reduced or prevented.

In addition or alternative to this, the adhesion layer 22 is preferably made of a metallic material which oxidizes more easily than the metallic material of the side-surface ground conductor 14 (ground conductor material) (for example, in the present preferred embodiment, copper). That is, the adhesion layer 22 is preferably made of a metallic material having a lower standard redox potential than a standard redox potential of the metallic material of the side-surface ground conductor 14. Therefore, oxidation of the side-surface ground conductor 14 can be reduced or prevented.

More specifically, in the manufacturing processes illustrated in FIGS. 2A to 2F, oxidation (embrittlement) occurs at a portion of the side-surface ground conductor 14 near the interface with the multilayer body 12. When the side-surface ground conductor 14 partially oxidizes, the stress from the thermally expanded multilayer body 12 concentrates on a boundary between the oxidized portion and the unoxidized portion of the side-surface ground conductor 14. As a result, the side-surface ground conductor 14 may rupture at the boundary. In order to deal with this, by the adhesion layer 22 oxidizing between the side-surface ground conductor 14 and the multilayer body 12 (that is, binding to oxygen therearound instead of the side-surface ground conductor 14), oxidation of the side-surface ground conductor 14 is reduced or prevented.

Further, as illustrated in FIG. 1, a thickness t1 of the adhesion layer 22 is preferably smaller than a thickness t2 of the side-surface ground conductor 14. As described above, when the thickness t2 of the side-surface ground conductor 14 is about 3 µm, the thickness t1 of the adhesion layer 22 is about 10 to about 20 nm, for example. Therefore, the adhesion layer 22 can deform correspondingly to the deformation of the side surface 12a of the thermally expanded multilayer body 12. That is, when the adhesion layer 22 is too thick, it cannot deform correspondingly to the deformation of the side surface 12a, and thus, the adhesion layer 22 may peel from the side surface 12a while holding the side-surface ground conductor 14.

In order to reduce or prevent the peeling of the adhesion layer 22 holding the side-surface ground conductor 14 from the side surface 12a of the multilayer body 12, a surface roughness of the side surface 12a of the multilayer body 12 is preferably higher than a surface roughness of the end surfaces 12b, 12c of the multilayer body 12. Therefore, mechanical connection between the adhesion layer 22 and the side surface 12a of the multilayer body 12 is strengthened. That is, an anchor effect improves. For this reason, the side surface 12a of the multilayer body 12 may be roughened.

The adhesion layer 22 is not provided between each of the end-surface ground conductors 18 and 20 and the multilayer body 12. That is, the end-surface ground conductors 18 and 20 are directly provided on the end surfaces 12b and 12c of the multilayer body 12, respectively. The reason for this is as follows. The end-surface ground conductors 18 and 20 are provided to the multilayer body 12 having a larger contact area than the side-surface ground conductor 14. Further, the difference between the coefficient of thermal expansion of the resin base-material layer in the plane direction (for example, approximately 16 ppm when made of a liquid crystal polymer resin) and the coefficient of thermal expansion of the metallic material of the end-surface ground conductors 18 and 20 (ground conductor material) (for example, approximately 17 ppm when made of copper) is not large. Therefore, the peeling is unlikely to occur. In other words, in order to preferentially reduce or prevent peeling of the end-surface ground conductors 18 and 20, a metallic material with a coefficient of thermal expansion at a comparable level with the coefficient of thermal expansion of the resin base-material layer in the plane direction is selected as the ground conductor material of the end-surface ground conductors 18 and 20. A reason for this priority is that the end-surface ground conductors 18 and 20 oppose the circuit conductor 16 having a closer distance and a larger area opposing thereto compared with the side-surface ground conductor 14. Then, if such end-surface ground conductors 18 and 20 peel, the high-frequency characteristics of the circuit conductor 16 is changed largely. Therefore, the end-surface ground conductors 18 and 20 are directly provided to the end surfaces 12b and 12c of the multilayer body 12, respectively, without the adhesion layer 22 interposed therebetween. The expression "directly" as used herein includes that the end-surface ground conductors 18 and 20 are provided to the multilayer body 12 with oxide of the end-surface ground conductors 18 and 20 or an altered substance of the resin base-material layer which is generated in the manufacturing process (that is, a product deriving from the metallic material of the end-surface ground conductors 18 and or the resin material of the resin base-material layer) interposed therebetween.

Further, another reason for not providing the adhesion layer 22 between the end-surface ground conductors 18 and 20 and the multilayer body 12 (that is, to the end surfaces 12b and 12c of the multilayer body 12) is that the adhesion layer 22 made of a metallic material largely affects the high-frequency characteristics of the circuit conductor 16. When the adhesion layer 22 is provided to the end surfaces 12b and 12c of the multilayer body 12, the adhesion layer 22 opposes the circuit conductor 16 having a closer distance and a larger area opposing thereto. Thus, variations in the thickness of the adhesion layer 22 (film formation accuracy) may cause variations in the high-frequency characteristics of the circuit conductor 16. Also for such a reason, the adhesion layer 22 is not provided between each of the end-surface ground conductors 18 and 20 and the multilayer body 12. Note that variations in the thickness of the adhesion layer 22 provided between the side-surface ground conductor 14 and the side surface 12a of the multilayer body 12 do not substantially cause characteristic variations of the circuit conductor 16. This is because the adhesion layer 22 opposes the circuit conductor 16 having a long distance and a small area opposing thereto and a degree of freedom in designing the distance between the adhesion layer 22 and the circuit conductor 16 is high.

According to the present preferred embodiment as described above, in the resin multilayer substrate 10 which is formed by laminating the plurality of resin base-material layers and includes the side-surface ground conductor 14 on the side surface 12a thereof, peeling of the side-surface ground conductor 14 from the side surface 12a due to thermal expansion of the resin base-material layer can be reduced or prevented.

Although the present invention has been described with reference to the preferred embodiment described above, preferred embodiments of the present invention are not limited thereto.

For example, the manufacturing method of the resin multilayer substrate according to the above-described preferred embodiment of the present invention is not limited to the method through the manufacturing processes illustrated in FIGS. 2A to 2F.

FIGS. 3A to 3D are views illustrating another example of the manufacturing processes of the resin multilayer substrate.

Figure 3A:
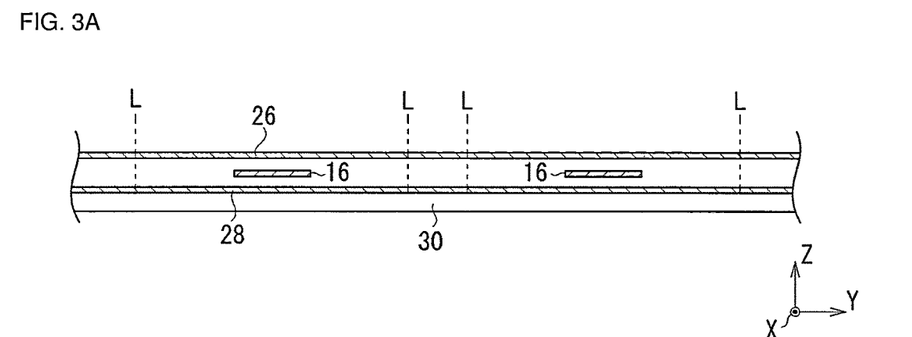
FIG. 3A is a view illustrating another example of the manufacturing process of the resin multilayer substrate.
Figure 3B:
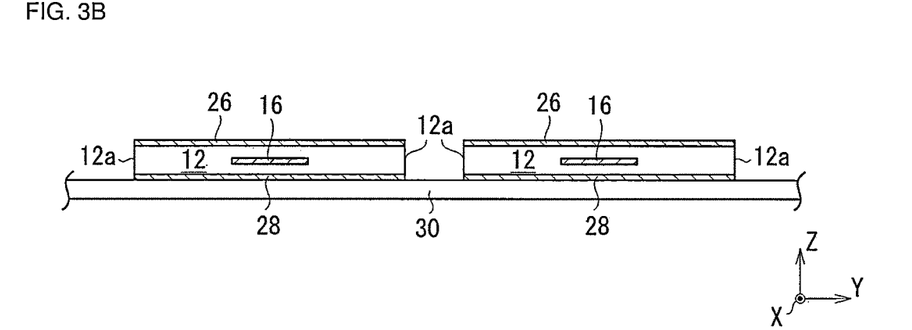
FIG. 3B is a view illustrating a manufacturing process subsequent to the manufacturing process illustrated in FIG. 3A.

In another example of the manufacturing method of the resin multilayer substrate illustrated in FIGS. 3A to 3D, the resist layer is not used unlike the one example of the manufacturing method of the resin multilayer substrate illustrated in FIGS. 2A to 2F. Therefore, through selective cutting by the laser L or the like as illustrated in FIG. 3A, the multilayer body 12 provided with the copper foil 26 and 28 without the resist layer remains on the carrier film 30 as illustrated in FIG. 3B.

Figure 3C:
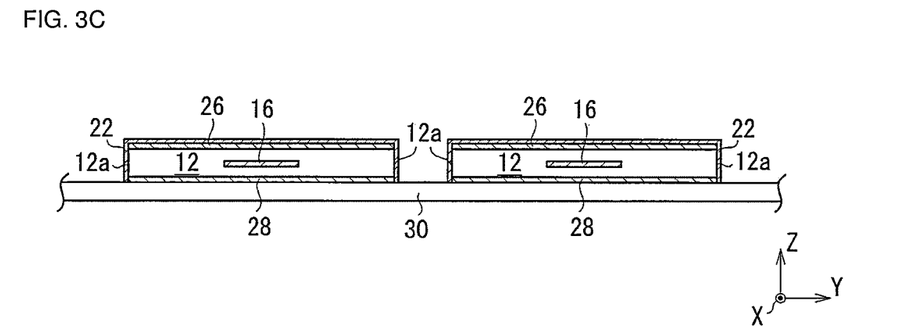
FIG. 3C is a view illustrating a manufacturing process subsequent to the manufacturing process illustrated in FIG. 3B.

Next, as illustrated in FIG. 3C, the adhesion layer 22 is formed on the side surface 12a of the multilayer body 12 provided with the end-surface ground conductors 18 and 20, through film formation processing, such as, for example, vapor deposition, plating, and sputtering. The adhesion layer 22 is formed also on one copper foil 26.

Figure 3D:
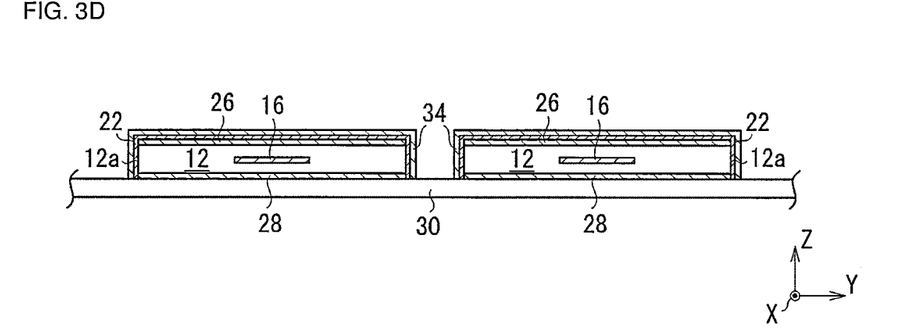
FIG. 3D is a view illustrating a manufacturing process subsequent to the manufacturing process illustrated in FIG. 3C.

Then, as illustrated in FIG. 3D, the copper layer 34 is formed on the adhesion layer 22 on the side surface 12a of the multilayer body 12 through film formation processing, such as, for example, vapor deposition, plating, and sputtering. The copper layer 34 is formed also on the adhesion layer 22 on the copper foil 26. Therefore, making the resin multilayer substrate is completed on the carrier film 30.

That is, in the resin multilayer substrate 10 manufactured though the manufacturing processes illustrated in FIGS. 3A to 3D, one end-surface ground conductor 18 is made of the copper foil 26, the adhesion layer 22, and the copper layer 34. Since the adhesion layer 22 opposes the circuit conductor 16 with the copper foil 26 interposed therebetween, the adhesion layer 22 does not affect the high-frequency characteristics of the circuit conductor 16.

Further, in the preferred embodiment described above, as illustrated in FIGS. 2A to 2F, the resin multilayer substrate 10 is manufactured on the carrier film 30. However, preferred embodiments of the present invention are not limited thereto. For example, the multilayer body 12 provided with the end-surface ground conductors 18 and 20 which have been cut by the laser as illustrated in FIG. 2C may be removed from the carrier film 30, and then the film formation processing of the adhesion layer 22 and the copper layer 34 may be performed. In this case, eventually, one end-surface ground conductor 18 is made of the copper foil 26, the adhesion layer 22, and the copper layer 34, and the other end-surface ground conductor 20 is made of the copper foil 28, the adhesion layer 22, and the copper layer 34.

Further, in the preferred embodiment described above, the plurality of resin substrates (resin films 24A to 24C) which define the multilayer body 12 of the resin multilayer substrate are thermally pressure-bonded to each other. However, preferred embodiments of the present invention are not limited thereto.

Figure 4:
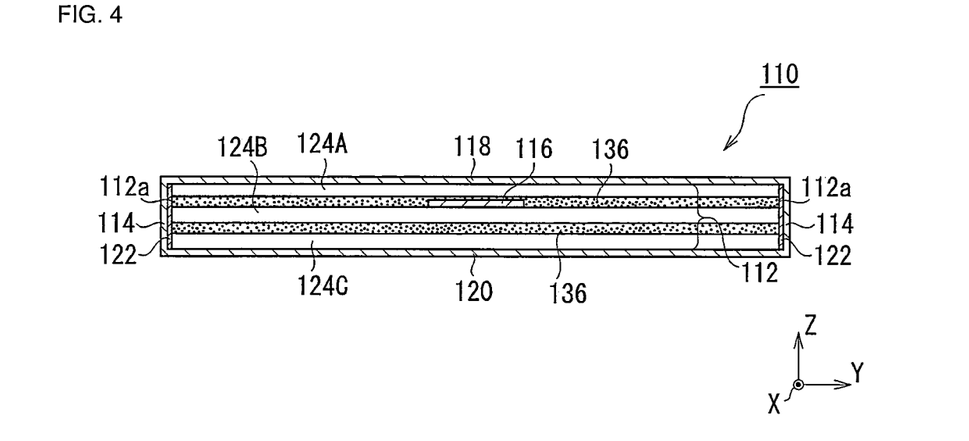
FIG. 4 is a sectional view of a resin multilayer substrate according to another preferred embodiment of the present invention.

FIG. 4 is a sectional view of a resin multilayer substrate according to another preferred embodiment of the present invention.

As illustrated in FIG. 4, in a resin multilayer substrate 110 according to the present preferred embodiment, a multilayer body 112 includes a plurality of resin base-material layers (resin films) 124A to 124C and an adhesive layer 136 disposed between the adjacent resin base-material layers. That is, the plurality of resin base-material layers 124A to 124C are indirectly adhered to each other with the adhesive layer (adhesive) 136 interposed therebetween. The adhesive layer 136 is an adhesive, for example, including a fluoropolymer, whose coefficient of thermal expansion in the thickness direction (Z-axis direction) is lower than the coefficient of thermal expansion of the resin base-material layer in the thickness direction, the adhesive being excellent in high-frequency characteristics.

By the existence of the adhesive layer 136, thermal expansion of the multilayer body 112 in the thickness direction (Z-axis direction) is reduced or prevented (compared with the case where the resin base-material layers are thermally pressure-bonded to each other). As a result, peeling of a side-surface ground conductor 114 from the side surface 112a of the multilayer body 112 is further reduced or prevented.

Furthermore, in the present preferred embodiment described above, the side-surface ground conductor is the copper layer provided on the adhesion layer through the film formation processing, such as, for example, vapor deposition, plating, and sputtering. However, preferred embodiments of the present invention are not limited thereto.

For example, the side-surface ground conductor may be made of a layered compound (for example, MXene) having conductivity. The MXene may be $Ti_3C_2$, for example. A thin film formed by such a layered compound has conductivity and high flexibility for its multilayer structure. Moreover, in the case of $Ti_3C_2$, since Ti and C are the main components, a coefficient of thermal expansion thereof is assumed to be lower than the coefficient of thermal expansion of the resin base-material layer made of a thermoplastic resin whose main raw material is a liquid crystal polymer resin in the thickness direction (approximately 300 ppm). Further, the thin film of such a layered compound has high shielding performance because of multipath reflection between the layers.

The thin film of such a layered compound is made, for example, by being applied on the multilayer body of the resin base-material layer by spray or the like. More specifically, a layered compound including resin binder which improves adhesiveness between the thin film and the multilayer body (resin base-material layer) is applied to the multilayer body of the resin base-material layer. The interface between the multilayer body of the resin base-material layer and the thin film is impregnated with the resin binder in a layered manner so as to improve the adhesiveness (compared with a case without the resin binder). That is, the layered resin binder at the interface defines and functions as an adhesion layer. A material of the resin binder may be a polyurethane resin, for example.

The side-surface ground conductor made of the layered compound can deform correspondingly even when the multilayer body of the resin base-material layer thermally expands in the thickness direction. As a result, peeling of the side-surface ground conductor from the side surface of the multilayer body can be reduced or prevented.

In addition to the side-surface ground conductor, the end-surface ground conductor may also be made of a layered compound. For example, when the resin multilayer substrate is used as a flexible substrate, damage (for example, rupture) of the end-surface ground conductor due to bending deformation can be reduced or prevented.

In addition, in the preferred embodiment described above, as illustrated in FIG. 1, the end-surface ground conductors 18 and 20 respectively cover the entire or substantially the entire end surfaces 12b and 12c of the multilayer body 12. Further, the side-surface ground conductor 14 covers the entire or substantially the entire side surface 12a of the multilayer body 12. However, preferred embodiments of the present invention are not limited thereto. For example, the end-surface ground conductor may cover a portion of the end surface of the multilayer body, and an electrode which transmits and receives signals to and from an external device may be provided to the other portion of the end surface. The end-surface ground conductor and the side-surface ground conductor are preferably provided to the entire or substantially the entire end surface and the entire or substantially the entire side surface of the multilayer body, respectively, if possible. However, even when the end-surface ground conductor and the side-surface ground conductor are respectively provided to a portion of the end surface and a portion of the side surface, the resin multilayer substrate can achieve a shielding effect.

That is, in a broad sense, a resin multilayer substrate according to an preferred embodiment of the present invention includes a multilayer body including a plurality of resin base-material layers laminated in a thickness direction and a circuit conductor therein, an end-surface ground conductor directly on each end surface of the multilayer body in the thickness direction, an adhesion layer on a side surface of the multilayer body, and a side-surface ground conductor on the adhesion layer. The end-surface ground conductor and the side-surface ground conductor are made of a ground conductor material with a coefficient of thermal expansion whose difference from a coefficient of thermal expansion of the resin base-material layers in a plane direction is smaller than a difference from a coefficient of thermal expansion of the resin base-material layers in the thickness direction. The adhesion layer is made of a material having higher adhesiveness to the side surface of the multilayer body than adhesiveness of the ground conductor material.

Further, in a broad sense, a method of manufacturing a resin multilayer substrate according to a preferred embodiment of the present invention includes making a multilayer body by laminating, in a thickness direction, a plurality of resin films including a conductor layer, the multilayer body including an end-surface ground conductor directly provided to each end surface of the multilayer body in the thickness direction, and a circuit conductor provided inside the multilayer body, forming an adhesion layer on a side surface of the multilayer body, and forming a conductor layer configured to be a side-surface ground conductor on the adhesion layer. The end-surface ground conductor and the side-surface ground conductor are made of a ground conductor material with a coefficient of thermal expansion whose difference from a coefficient of thermal expansion of resin base-material layers in a plane direction is smaller than a difference from a coefficient of thermal expansion of the resin base-material layers in the thickness direction. The adhesion layer is made of a material having higher adhesiveness to the side surface of the multilayer body than adhesiveness of the ground conductor material.

Furthermore, in a broad sense, a method of manufacturing a resin multilayer substrate according to a preferred embodiment of the present invention includes making a multilayer body by laminating, in a thickness direction, a plurality of resin films including a conductor layer, the multilayer body including an end-surface ground conductor directly provided to each end surface of the multilayer body in the thickness direction, and a circuit conductor provided inside the multilayer body, forming an adhesion layer on a side surface of the multilayer body, and forming a side-surface ground conductor by applying a ground conductor material on the adhesion layer. The end-surface ground conductor and the side-surface ground conductor are made of a ground conductor material with a coefficient of thermal expansion whose difference from a coefficient of thermal expansion of resin base-material layers in a plane direction is smaller than a difference from a coefficient of thermal expansion of the resin base-material layers in the thickness direction. The adhesion layer is made of a material having higher adhesiveness to the side surface of the multilayer body than adhesiveness of the ground conductor material.

Preferred embodiments of the present invention are applicable to a resin multilayer substrate formed by laminating a plurality of resin base-material layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
    a multilayer body including a plurality of resin base-material layers laminated in a thickness direction;
    a circuit conductor inside the multilayer body;
    an end-surface ground conductor provided directly on each end surface of the multilayer body in the thickness direction;
    an adhesion layer on a side surface of the multilayer body; and
    a side-surface ground conductor on the adhesion layer; wherein
    the end-surface ground conductor and the side-surface ground conductor are made of a ground conductor material with a coefficient of thermal expansion whose difference from a coefficient of thermal expansion of the resin base-material layers in a plane direction is smaller than a difference from a coefficient of thermal expansion of the resin base-material layers in the thickness direction; and
    the adhesion layer is made of a material with higher adhesiveness to the side surface of the multilayer body than adhesiveness of the ground conductor material.

2. The resin multilayer substrate according to claim 1, wherein the adhesion layer is made of a metallic material.

3. The resin multilayer substrate according to claim 2, wherein the adhesion layer is made of a metallic material with a coefficient of thermal expansion between the coefficient of thermal expansion of the ground conductor material and the coefficient of thermal expansion of the resin base-material layers in the thickness direction.

4. The resin multilayer substrate according to claim 2, wherein the adhesion layer is made of a metallic material that oxidizes more easily than the ground conductor material.

5. The resin multilayer substrate according to claim 1, wherein the side-surface ground conductor is made of a ground conductor material including Ti or C as a main component.

6. The resin multilayer substrate according to claim 1, wherein a thickness of the adhesion layer is smaller than a thickness of the side-surface ground conductor.

7. The resin multilayer substrate according to claim 1, wherein a surface roughness of the side surface of the multilayer body is higher than a surface roughness of the end surface.

8. The resin multilayer substrate according to claim 1, wherein the resin base-material layers are made of a thermoplastic resin including a liquid crystal polymer resin.

9. The resin multilayer substrate according to claim 1, wherein the multilayer body includes an adhesive layer between resin base-material layers of the plurality of resin base-material layers adjacent to each other and includes a fluoropolymer.

10. A method of manufacturing a resin multilayer substrate, the method comprising:
    making a multilayer body by laminating, in a thickness direction, a plurality of resin films including a conductor layer, the multilayer body including an end-surface ground conductor provided directly on each end surface of the multilayer body in the thickness direction, and a circuit conductor provided inside the multilayer body;
    forming an adhesion layer on a side surface of the multilayer body; and
    forming a conductor layer to define a side-surface ground conductor on the adhesion layer; wherein
    the end-surface ground conductor and the side-surface ground conductor are made of a ground conductor material with a coefficient of thermal expansion whose difference from a coefficient of thermal expansion of resin base-material layers in a plane direction is smaller than a difference from a coefficient of thermal expansion of the resin base-material layers in the thickness direction; and
    the adhesion layer is made of a material with higher adhesiveness to the side surface of the multilayer body than adhesiveness of the ground conductor material.

11. The method of manufacturing a resin multilayer substrate according to claim 10, wherein the adhesion layer is made of a metallic material.

12. The method of manufacturing a resin multilayer substrate according to claim 11, wherein the adhesion layer is made of a metallic material with a coefficient of thermal expansion between the coefficient of thermal expansion of the ground conductor material and the coefficient of thermal expansion of the resin base-material layers in the thickness direction.

13. The method of manufacturing a resin multilayer substrate according to claim 11, wherein the adhesion layer is made of a metallic material that oxidizes more easily than the ground conductor material.

14. A method of manufacturing a resin multilayer substrate, the method comprising:
   making a multilayer body by laminating, in a thickness direction, a plurality of resin films including a conductor layer, the multilayer body including an end-surface ground conductor provided directly on each end surface of the multilayer body in the thickness direction, and a circuit conductor provided inside the multilayer body;
   forming an adhesion layer on a side surface of the multilayer body; and
   forming a side-surface ground conductor by applying a ground conductor material on the adhesion layer; wherein
   the end-surface ground conductor and the side-surface ground conductor are made of the ground conductor material with a coefficient of thermal expansion whose difference from a coefficient of thermal expansion of resin base-material layers in a plane direction is smaller than a difference from a coefficient of thermal expansion of the resin base-material layers in the thickness direction; and
   the adhesion layer is made of a material having with adhesiveness to the side surface of the multilayer body than adhesiveness of the ground conductor material.

15. The method of manufacturing a resin multilayer substrate according to claim 14, wherein a main component of the ground conductor material of the side-surface ground conductor is Ti or C.

16. The method of manufacturing a resin multilayer substrate according to claim 14, wherein a main component of the ground conductor material of the side-surface ground conductor is Ti or C.

17. The method of manufacturing a resin multilayer substrate according to claim 14, wherein the adhesion layer is made of a metallic material.

18. The method of manufacturing a resin multilayer substrate according to claim 17, wherein the adhesion layer is made of a metallic material with a coefficient of thermal expansion between the coefficient of thermal expansion of the ground conductor material and the coefficient of thermal expansion of the resin base-material layers in the thickness direction.

19. The method of manufacturing a resin multilayer substrate according to claim 17, wherein the adhesion layer is made of a metallic material that oxidizes more easily than the ground conductor material.

20. The method of manufacturing a resin multilayer substrate according to claim 14, wherein a thickness of the adhesion layer is smaller than a thickness of the ground conductor material of the side-surface ground conductor.

* * * * *